US006281794B1

(12) United States Patent
Duan et al.

(10) Patent No.: US 6,281,794 B1
(45) Date of Patent: Aug. 28, 2001

(54) RADIO FREQUENCY TRANSPONDER WITH IMPROVED READ DISTANCE

(75) Inventors: Dah-Weih Duan, Yorktown Heights; Harley Kent Heinrich, Brewster, both of NY (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/318,590

(22) Filed: May 25, 1999

Related U.S. Application Data

(63) Continuation-in-part of application No. 09/225,432, filed on Jan. 5, 1999, now abandoned, and a continuation-in-part of application No. 09/225,846, filed on Jan. 2, 1999, now abandoned, and a continuation-in-part of application No. 09/191,642, filed on Nov. 13, 1998, now Pat. No. 6,215,402, and a continuation-in-part of application No. 09/191,641, filed on Nov. 13, 1998, now Pat. No. 6,118,379, and a continuation-in-part of application No. 09/192,052, filed on Nov. 13, 1998, now Pat. No. 6,177,872.

(60) Provisional application No. 60/070,445, filed on Jan. 5, 1998, provisional application No. 60/077,879, filed on Mar. 13, 1998, provisional application No. 60/078,184, filed on Mar. 16, 1998, provisional application No. 60/078,220, filed on Mar. 16, 1998, provisional application No. 60/078,287, filed on Mar. 17, 1998, provisional application No. 60/070,336, filed on Jan. 2, 1998, and provisional application No. 60/070,350, filed on Jan. 2, 1998.

(51) Int. Cl.$^7$ ................................................. G08D 13/14
(52) U.S. Cl. ................... 340/572.1; 340/10.1; 340/10.4; 343/711; 343/700 MS; 343/860; 342/42; 342/44
(58) Field of Search ........................ 340/572.1, 10.1, 340/10.4; 343/860, 711, 700 MS; 342/44, 42; 455/215; 333/32

(56) References Cited

U.S. PATENT DOCUMENTS 4,068,232 * 1/1978 Meyers et al. ..................... 342/44

| 4,075,632 | 2/1978 | Baldwin et al. | 340/10.51 |
|---|---|---|---|
| 4,326,203 | * 4/1982 | Kaloi | 343/700 MS |
| 4,360,810 | 11/1982 | Landt | 340/10.6 |
| 4,782,345 | 11/1988 | Landt | 342/51 |
| 4,786,907 | 11/1988 | Koelle | 340/572.1 |
| 4,816,389 | 3/1989 | Sansonetti et al. | 340/572.1 |
| 4,835,377 | 5/1989 | Brown | 375/136 |
| 4,853,705 | 8/1989 | Landt | 29/827 |
| 4,864,158 | 9/1989 | Koelle et al. | 340/825.69 |
| 4,888,591 | 12/1989 | Landt et al. | 343/700 MS |
| 4,999,636 | 3/1991 | Landt et al. | 340/572.6 |
| 5,030,807 | 7/1991 | Landt et al. | 340/10.34 |

(List continued on next page.)

FOREIGN PATENT DOCUMENTS

| 0 294 963 | 12/1988 | (EP) . |
| 0 646 983 | 4/1995 | (EP) . |
| WO 98/16070 | 4/1998 | (WO) . |

OTHER PUBLICATIONS

"Multifunction Credit Card Package" IBM Technical Disclosure Bulletin, vol. 38, No. 08, Aug. 1995, p. 17.

"A Low–Power CMOS Integrated Circuit for Field–Powered Radio Frequency Identification Tag" By Friedman et al., 1997 IEEE International Solid State Circuits Conference, Paper SA 17.5, pp. 294, 295, 474.

Primary Examiner—Benjamin C. Lee
(74) Attorney, Agent, or Firm—O'Melveny & Myers LLP

(57) ABSTRACT

A radio frequency identification transponder (RFID tag) in accordance with the principles of the present invention includes a tag antenna and RFID circuitry having respective input impedances Za and ZL. In accordance with the principles of the invention, the read distance of the RFID tag is maximized by connecting an inductor in series between the antenna and the RFID tag circuitry. The inductor having an impedance ZL that maximizes the expression $[(Ra)(Ga)]^{1/2}|(ZL|/|Za+Zind+ZL|$, where $|\ |$ indicates the absolute value of the enclosed expression.

17 Claims, 6 Drawing Sheets

U.S. PATENT DOCUMENTS

| | | | |
|---|---|---|---|
| 5,055,659 | | 10/1991 | Hendrick et al. .................... 257/673 |
| 5,084,699 | * | 1/1992 | DeMichele .......................... 340/10.1 |
| 5,479,160 | | 12/1995 | Koelle ............................... 340/10.32 |
| 5,485,520 | | 1/1996 | Chaum et al. ................ 343/700 MS |
| 5,491,483 | * | 2/1996 | D'Hont ................................. 342/42 |
| 5,504,485 | | 4/1996 | Landt et al. ........................ 340/10.1 |
| 5,510,795 | | 4/1996 | Koelle ............................... 340/572.2 |
| 5,521,601 | | 5/1996 | Kandlur et al. .......................... 701/1 |
| 5,528,222 | | 6/1996 | Moskowitz et al. .............. 340/572.1 |
| 5,538,803 | | 7/1996 | Gambino et al. ...................... 705/23 |
| 5,550,547 | | 8/1996 | Chan et al. ....................... 340/572.1 |
| 5,552,778 | | 9/1996 | Schrott et al. .................... 340/10.33 |
| 5,554,974 | | 9/1996 | Brady et al. ...................... 340/572.7 |
| 5,563,583 | | 10/1996 | Brady et al. ...................... 340/10.32 |
| 5,565,847 | | 10/1996 | Gambino et al. .................. 340/10.33 |
| 5,572,170 | * | 11/1996 | Collins et al. ......................... 333/32 |
| 5,606,323 | | 2/1997 | Heinrich et al. .................. 340/10.34 |
| 5,630,216 | * | 5/1997 | McEwan .............................. 455/215 |
| 5,635,693 | | 6/1997 | Benson et al. .................... 340/572.6 |
| 5,673,037 | | 9/1997 | Cesar et al. ...................... 340/572.2 |
| 5,680,106 | | 10/1997 | Schrott et al. .................... 340/572.6 |
| 5,682,143 | | 10/1997 | Brady et al. ........................ 340/10.4 |
| 5,686,928 | * | 11/1997 | Pritchett et al. ..................... 343/711 |
| 5,729,201 | | 3/1998 | Jahnes et al. ........................... 342/42 |
| 5,729,697 | | 3/1998 | Schkolnick et al. .......... 428/694 TM |
| 5,736,929 | | 4/1998 | Schrott et al. .................... 340/572.7 |
| 5,737,710 | | 4/1998 | Anthonyson ........................... 342/44 |
| 5,739,754 | | 4/1998 | Schrott et al. ....................... 342/114 |
| 5,767,789 | | 6/1998 | Afzali-Ardakani et al. ........... 342/42 |
| 5,771,021 | | 6/1998 | Veghte et al. ......................... 705/74 |
| 5,777,561 | | 7/1998 | Chieu et al. ...................... 340/825.7 |
| 5,786,626 | | 7/1998 | Brady et al. ...................... 340/10.51 |
| 5,812,065 | | 9/1998 | Schrott et al. ........................ 235/375 |
| 5,821,859 | | 10/1998 | Schrott et al. ......................... 342/90 |
| 5,825,329 | | 10/1998 | Veghte et al. ......................... 342/44 |
| 5,826,328 | | 10/1998 | Brady et al. ........................... 327/31 |
| 5,828,318 | | 10/1998 | Cesar ................................... 343/803 |
| 5,828,693 | | 10/1998 | Mays et al. ........................... 235/492 |
| 5,831,532 | | 11/1998 | Gambino et al. ........................ 435/6 |
| 5,850,181 | | 12/1998 | Heinrich et al. ....................... 342/51 |
| 5,850,187 | | 12/1998 | Carrender et al. ................... 343/727 |
| 5,874,902 | | 2/1999 | Heinrich et al. ....................... 344/44 |
| 5,926,093 | * | 7/2000 | Bowers et al. .................... 340/572.1 |
| 6,046,668 | * | 4/2000 | Forster ................................ 340/10.4 |
| 6,121,940 | * | 9/2000 | Skahill et al. ........................ 343/860 |

\* cited by examiner

RADIO FREQUENCY TRANSPONDER WITH IMPROVED READ DISTANCE

CROSS-REFERENCE TO RELATED APPLICATIONS

The present application is a continuation-in-part of application Ser. No. 09/225,432 filed Jan. 5, 1999, abandoned, which claims the benefit of U.S. Provisional Application No. 60/070,445 filed Jan. 5, 1998, both of applications Ser. No. 09/225,432 and No. 60/070,445 being specifically incorporated herein, in their entireties, by reference. The present application also claims the benefit of Provisional applications No. 60/077,879 field Mar. 13, 1998 No. 60/078,184 filed Mar. 16, 1998 No. 60/078,220 filed Mar. 16, 1998, and No. 60/078,287 filed Mar. 17, 1998. Application Ser. No. 09/225,432 is a continuation in part of applications No. 09/191,642, now U.S. Pat. No. 6,215,402, Ser. No. 09/191,641, now U.S. Pat. No. 6,118,379, and Ser. No. 09/192,052, filed Nov. 13, 1998, now U.S. Pat. No. 6,177,872, and Ser. No. 09/225,846 filed Jan. 2, 1999 abandoned, which claims the benefit of Provisional Applications No. 60/070,336 filed Jan. 2, 1998 and No. 60/070,350 filed Jan. 2, 1998.

All of the above provisional and nonprovisional applications are hereby incorporated herein by reference in their entireties including their drawings and appendices.

FIELD OF THE INVENTION

The invention relates to radio frequency transponders, and, more particularly, to apparatus and method for improving the range of such transponders.

BACKGROUND OF THE INVENTION

Radio Frequency Identification (RFID) transponders (tags) are operated in conjunction with RFID base stations for a variety of inventory-control, security and other purposes. Typically an item having a tag associated with it, for example, a container with a tag placed inside it, is brought into a "read zone" established by the base station. The RFID base station generates a continuous wave electromagnetic disturbance at a carrier frequency. This disturbance is modulated to correspond to data that is to be communicated via the disturbance. The modulated disturbance, which carries information and may be referred to as a signal, communicates this information at a rate, referred to as the data rate, which is lower than the carrier frequency. The transmitted disturbance will be referred to hereinafter as a signal or field. The RFID base station transmits an interrogating RF signal which is modulated by a receiving tag in order to impart information stored within the tag to the signal. The receiving tag then transmits the modulated, answering, RF signal to the base station.

RFID tags may be active, containing their own RF transmitter, or passive, having no transmitter. Passive tags, i.e., tags that rely upon modulated back-scattering to provide a return link to an interrogating base station, may include their own power sources, such as batteries, or they may be "field-powered", whereby they obtain their operating power by rectifying an interrogating RF signal that is transmitted by a base station. Although both types of tag have minimum RF field strength read requirements, or read thresholds, in general, a field-powered passive system requires at least an order of magnitude more power in the interrogating signal than a system that employs tags having their own power sources. Because the interrogating signal must provide power to a field-powered passive tag, the read threshold for a field-powered passive tag is typically substantially higher than for an active tag. However, because field-powered passive tags do not include their own power source, they may be substantially less expensive than active tags and because they have no battery to "run down", field-powered passive tags may be more reliable in the long term than active tags. Because they do not include a battery, field-powered passive tags are typically much more "environmentally-friendly".

Such RFID systems provide significant advantages over conventional identification systems, such as barcode identification systems, in the identification, tracking, and control of objects with which they are associated. RFID systems provide a rapid read rate, whereby a number of RFID transponders, or tags, may be quickly read, outside the line-of-sight of, and at some remote location from an interrogating base station. Additionally, unlike bar codes or other write-once, read-many information storage systems, RFID tags may provide the ability of updating the information stored within the tag. Nevertheless, RFID systems would benefit from tags which are readable at as great a distance as possible.

In order to increase the operating distance of an RFID tag, one might operate at a lower carrier frequency. However, this may require a larger antenna and, therefore, a larger tag. In fact, the tag may be so big as to preclude its use in specific applications. Additionally, larger antennas may preclude the use of diversity schemes involving various positions, directions of propagation, signal polarization, and other techniques that may otherwise be employed to ensure a high "capture" or "read" rate at a given distance. Higher gain antennas may also be bulky and inconvenient for use in certain automatic identification applications. Although a brute-force approach, such as increasing the transmitting power may increase a tag's read distance, there are limits imposed, by governmental agencies, for example, on the maximum radiated power permissible. An RFID tag that maximizes read distance for a given set of power and form-factor constraints would therefore be highly advantageous.

SUMMARY

A radio frequency identification transponder (RFID tag) in accordance with the principles of the present invention includes a tag antenna having a gain and an input impedance. The tag also includes RFID circuitry, which may be in the form of an RFID tag integrated circuit, the RFID circuitry also being characterized, in part, by an input impedance. According to the principles of the present invention the tag's read distance is maximized by adjusting the load impedance ZL, through the addition of an inductor in the path between the antenna and the RFID circuitry. The value of the added inductance is chosen to counteract the capacitive reactance of the RFID circuitry. In particular, the value of the added inductor is chosen to be substantially equal to the difference between the antenna reactance, if non-zero, and the RFID circuitry reactance, typically a capacitance, thereby reducing the net reactance of the antenna/RFID circuitry combination, preferably as close to zero as practical.

In an illustrative embodiment, the RFID tag circuitry is implemented on a single RFID integrated circuit (RFID IC), and the inductor is formed, using known "excavation" processing techniques, on the same RFID IC. The RFID tag antenna may also be incorporated into the RFID IC. That is, in an illustrative embodiment, an inductor is added to the RFID IC so that the following expression is maximized:

$$(R_a G_a)^{1/2}(|ZL|)/|Za+ZL+Zind|$$

where:

Za=antenna impedance

ZL=load, or RFID circuitry, impedance

Zind=impedance of the added inductor

| | indicates absolute value

---

Za = antenna impedance
ZL = load, or RFID circuitry, impedance
Zind = impedance of the added inductor
|| indicates absolute value

---

Additionally, the RFID tag may employ any of a variety of antennas and impedance matching circuits. For example the impedance matching disclosed in "Distributed Impedance Matching Circuit For High Reflection Coefficient Load," (Ser. No. 09/192,052 filed Nov. 13, 1998 and previously incorporated by reference) may be employed to tune the antenna impedance according to the principles of the present invention. Consequently, when reference is made hereinafter, in the specification or in the claims to an RFID antenna, matching circuitry may be included.

BRIEF DESCRIPTION OF THE DRAWINGS

The above and further features, aspects, and advantages of the invention will be apparent to those skilled in the art from the following detailed description, taken together with the accompanying drawings in which.

DETAILED DESCRIPTION

A radio frequency identification transponder (RFID tag) in accordance with the principles of the present includes a tag antenna characterized by a gain and an input impedance. The tag also includes RFID circuitry which also has an associated input impedance. According to the principles of the present invention, the tag's read distance is maximized by adding an inductor in series between the antenna and RFID tag circuit so that, in general, the reactance of the RFID circuitry, due primarily to parasitic capacitance, is canceled. That is, the inductor's value is selected so that the imaginary part of the inductor's impedance is equal in magnitude to the difference between the imaginary part of the RFID circuit's impedance and the imaginary part of the RFID antenna's impedance:

$$Xind+Xa+XL=0$$

Where:

Xind=the reactance of the inductor

Xa=the reactance of the antenna

XL=the reactance of the load, i.e., the RFID circuitry

---

Xind = the reactance of the inductor
Xa = the reactance of the antenna
XL = the reactance of the load, i.e., the RFID circuitry

---

Additionally, the real part of the tag antenna's impedance may be selected by adjusting the geometrical parameters so that an antenna criterion, embodied in the following expression, is maximized (assuming Z is given):

$$[(Ra)(Ga)]^{1/2}|(ZL|/|Za+Zind+ZL|$$

where:

Za=antenna impedance

ZL=load, or RFID circuitry, impedance

Zind=impedance of the added inductor

| | indicates absolute value (1)

---

Za = antenna impedance
ZL = load, or RFID circuitry, impedance
Zind = impedance of the added inductor
|| indicates absolute value        (1)

--- where:

$R_a$=the real part of the antenna impedance, or radiation resistance $G_a$=antenna gain Zind=inductor impedance $Z_a$=antenna impedance ZL=load, or RFID circuitry, impedance $|Z_a+Zind+ZL|$=absolute value of $(Z_a+Zind+ZL)$

| | |
|---|---|
| $R_a$ = | the real part of the antenna impedance, or radiation resistance |
| $G_a$ = | antenna gain |
| Zind = | inductor impedance |
| $Z_a$ = | antenna impedance |
| ZL = | load, or RFID circuitry, impedance |
| $\|Z_a + \text{Zind} + \text{ZL}\|$ = | absolute value of ($Z_a + \text{Zind} + \text{ZL}$) |

Maximization of this value may be accomplished by computing the value of the above equation for various values of each of the geometrical parameters which affect the antenna gain and impedance and selecting that set of values which maximizes the above expression.

Figure 1:
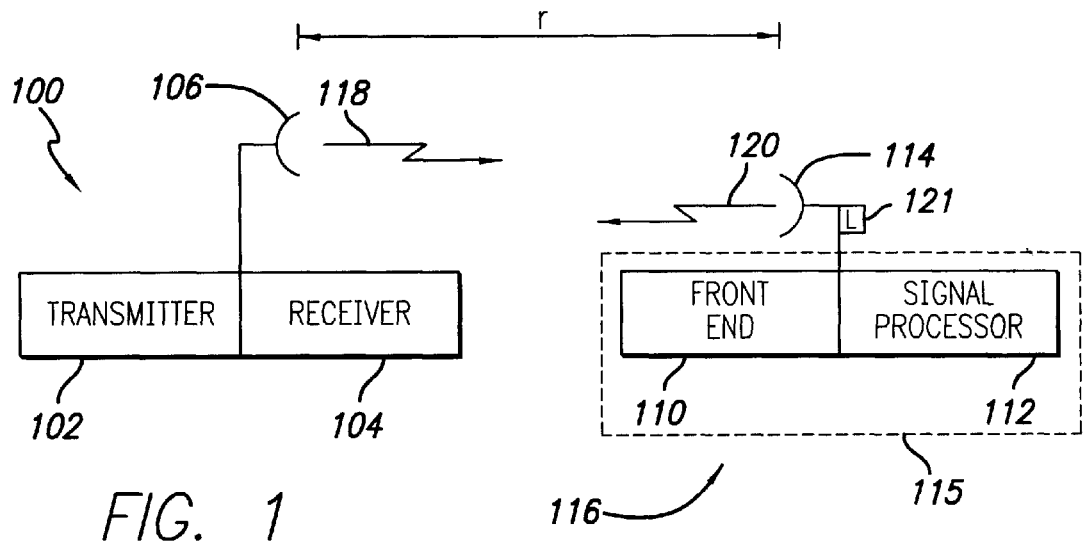
FIG. 1 is a conceptual block diagram of a radio frequency identification system in accordance with the principles of the present invention.

An RFID system in accordance with the principles of the present invention is illustrated in the conceptual block diagram of FIG. 1. An RF base station 100 includes an RF transmitter 102, an RF receiver 104, and an antenna 106 connected to the transmitter 102 and receiver 104. An RF tag 116 such as may be used in conjunction with the base station 100 includes an RF front end 110, a signal processing section 112, and an antenna 114. In the illustrative embodiment, the RFID tag front end 110 and signal processor 112 are incorporated in a radio frequency identification transponder integrated circuit (RFIC) 115. As will be described in greater detail below, an RFID tag in accordance with the principles of the invention includes an inductor 121, connected in series between the antenna 114 and the front end 110. In an illustrative embodiment, the inductor 121, antenna 114, front end 110, and signal processor 112 are all integrated on the RFIC 115.

In operation, the base station 100 interrogates the tag 116 by generating an RF signal having a carrier frequency $F_c$. The carrier frequency $F_c$ is chosen based on a number of factors known in the art, including the amount power permitted at that frequency by FCC regulations. The RF signal is coupled to the antenna 106 and transmitted to the tag 116. The RF signal emitted by the antenna 106, will, ostensibly, be received by the tag antenna 114 and, if the RF signal's field strength meets a read threshold requirement, the RF tag will respond to the reception of the signal by modulating the RF carrier to impart information about the associated container onto the back-scattered RF field, which propagates to the base station 100. The RF signal transmitted by the base station 100 must have sufficient field strength, taking into account the polarization of the signal and of the tag's antenna, at the location of the tag 116 for the tag to detect the RF signal. In the case of a field-powered passive tag, the interrogating signal's field strength generally must be great enough for the tag 116 to rectify the signal and to use the signal's energy for the tag's power source. The signal transmitted by the base station may be referred to as the forward link 118 and the back-scattered signal as the return link 120. The forward link transmitted will have an incident field strength $E^i$ at the tag antenna.

Figure 2:
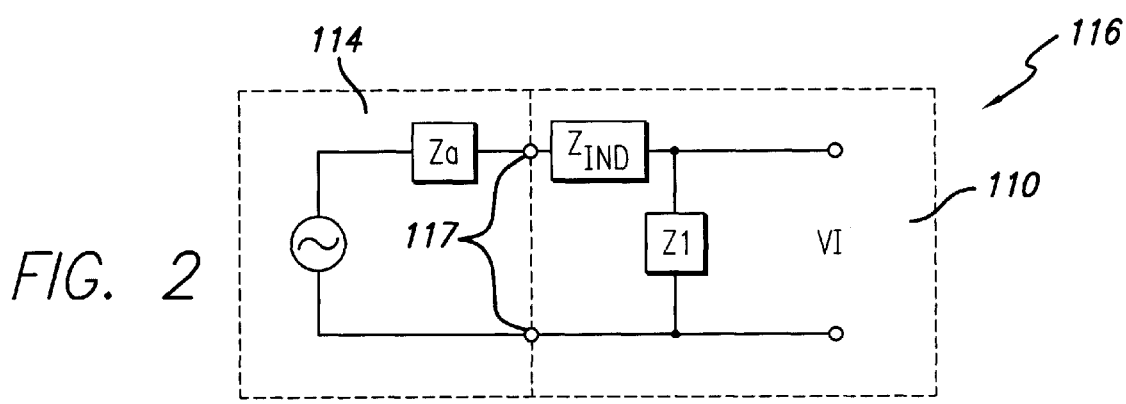
FIG. 2 is an equivalent circuit diagram of a radio frequency identification transponder (RFID tag) in accordance with the principles of the present invention.

The schematic block diagram of FIG. 2 illustrates an equivalent circuit model of the sources and loads associated with the new RFID tag 116. The antenna 114 is modeled as an open circuit voltage Voc in series with an antenna impedance $Z_a$. The tag front end 110, which may be embodied as a component of an RFID integrated circuit, is modeled as a load ZL imposed across the antenna terminals 117.

For a modulated back-scattering RFID system, the forward link read distance r may be related to the load voltage $V_l$ established at the RFID tag front end, as follows:

$$r=(1/k|V_l|)((2)(P_2)(R_a)(G_a)(G_1)(P_t))^{1/2}(|ZL/(Z_a+Z_{ind}+ZL)|) \quad (2)$$

where:

| | |
|---|---|
| r = | the RF tag read distance when only the forward link is considered |
| k = | $2\pi/\lambda_1$, where $\lambda$ is the carrier wavelength |
| $\|V_l\|$ = | absolute value of the minimum voltage required at the load (RF front end) |
| $P_2$ = | polarization matching factor for the tag antenna |
| $R_a$ = | tag antenna's radiation resistance i.e., $Z_a = R_a + jX_a$ |
| $G_a$ = | tag antenna gain |
| $G_1$ = | base station antenna gain |
| $P_t$ = | total transmitted power |
| $Z_{ind}$ = | inductor impedance |
| ZL = | load (front end) impedance |
| $Z_a$ = | tag antenna impedance | r=the RF tag read distance when only the forward link is considered k=$2\pi/\lambda_1$ where $\lambda$ is the carrier wavelength $|V_l|$=absolute value of the minimum voltage required at the load (RF front end)

$P_2$=polarization matching factor for the tag antenna $R_a$=tag antenna's radiation resistance
i.e., $Z_a=R_a+jX_a$ $G_a$=tag antenna gain $G_1$=base station antenna gain $P_t$=total transmitted power $Z_{ind}$=inductor impedance ZL=load (front end) impedance $Z_a$=tag antenna impedance When both the forward link and return link are considered, the read distance may be expressed as:

$$r=(1/(2k))(\gamma_2)(P_2)(G_a^2)(Q_1)(P_1)(G_1^2)(P_t/P_{min}))^{1/4} \quad (3)$$

Where:

| | |
|---|---|
| r = | RFID tag read distance |
| k = | $2\pi/\lambda$ |
| $\gamma_2$ = | the re-radiating impedance matching factor for the tag |
| | = $\|2 R_a/(Z_a + \text{Zind} + \text{ZL})\|^2$ |
| $P_2$ = | polarization matching factor for the tag |
| $G_2$ = | transponder antenna gain |
| $Q_1$ = | receiving impedance matching factor for the base station |
| $P_1$ = | polarization matching factor for the base station |
| $G_1$ = | base station antenna gain |
| $P_t$ = | total transmitted power from the base station |
| $P_{min}$ = | minimum back-scattered power required at the base station for a successful read | r=RFID tag read distance k=$2\pi/\lambda$ $\gamma_2$=the re-radiating impedance matching factor for the tag
    =$|2R_a/(Z_a+\text{Zind}=\text{ZL})|^2$ $P_2$=polarization matching factor for the tag $G_2$=transponder antenna gain $Q_1$=receiving impedance matching factor for the base station $P_1$=polarization matching factor for the base station $G_1$=base station antenna gain $P_t$=total transmitted power from the base station $P_{min}$=minimum back-scattered power required at the base station for a successful read The RFID tag read distance is determined by the lesser value of those obtained from equations 2 and 3. For most RFID tag systems, the read distance is limited by the value returned by equation 2, and such a limitation is addressed in accordance with the principles of the invention. That is, the read distance of an RFID tag is maximized by connecting an inductor having an impedance Zind in series between the tag antenna and the tag front end, the inductor selected to maximize the value of the following expression (assuming ZL is given):

$$[(Ra)(Ga)]^{1/2}|ZL|/|Ra+Rind+RI+J(Xa+Xind+XI)| \quad (4)$$

Wherein RI, Rind, and Ra are, respectively, the real parts of the load, inductor, and antenna impedances and, XI, Xin, and Xa are, respectively, the imaginary parts of the load, inductor, and antenna impedances.

That is, because the other parameters are typically predetermined, e.g. load impedance ZL is given, by the input impedance of an RFID integrated circuit, for example, the quantity $G_1 P_t$ is pre-determined by Federal Communications Commission regulations, etc., or the other factors may be assigned values, the read range of the tag is proportional to the antenna gain, the antenna impedance, and the load impedance as described in expression (4). Consequently, by maximizing $[(Ra)(Ga)]^{1/2}(ZL|/|Ra+Rind+RI+J(Xa+Xind+XI)|$, the read range is maximized for a given set of the other parameters. Typically, the load impedance, that is, the impedance of the RFIC, is capacitive and the technique simplifies to minimizing the following expression (assuming ZL, Za, and Ga are given):

$$|(Za+Zind+ZL)| \quad (5)$$

or, equivalently, $$|(Ra+Rind+RI+j(Xa+Xind+XI)| \quad (6)$$

This reduces to selecting an inductor such that $$Xind+Xa+XI=0 \quad (7)$$

In an illustrative method, the first step taken to mazimize expression (4) is to minimize expression (5) or (6). As a result, according to the principles of the invention, the read distance is maximized by setting the real part of the inductor, Rind, to a minimal value and the imaginary part of Zind, Xind, equal in magnitude to the difference between the magnitudes of the imaginary parts of the antenna, Xa, and load, XI, impedances, with the resulting expression:

r is proportional to $(Ra)^{1/2}|ZL|/2Ra=(RI)^{1/2}|ZL|/2RI=|ZL|/(2RI)^{1/2}$ (8)

In accordance with expression 8, minimizing the load resistance RI may further enhance the read distance. This reduction in load resistance must be traded off against the need for a load impedance that establishes a discernable signal at the tag front end, though.

Figure 3:
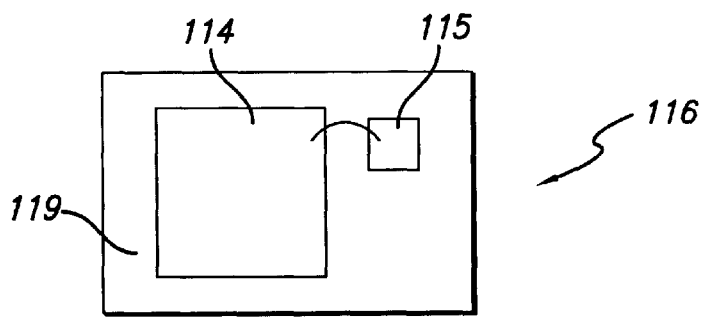
FIG. 3 is a top plan view of an RFID tag which employs a patch antenna, in accordance with the principles of the present invention.

The RFID tag 116 of FIG. 3 includes a patch antenna 114 electrically connected to an RFID integrated circuit 115. The antenna and RFID integrated circuit may be mounted using, for example, printed circuit board or hybrid circuit technology, on a substrate 119. In accordance with the principles of the invention an inductor 121 that satisfies expression 7 is placed in series between the antenna 114 and RFID IC 115. In an illustrative embodiment, the inductor 121 may be integrated with the front end and signal processing sections of the RFIC, by employing, for example an excavation technique, such as described in provisional applications Nos. 60/070,336 and 60/070,350 which are hereby incorporated by reference, and in IBM Technical Disclosure Bulletin Vol. 40 No. 11, November 1997, page 193, "Performance Enhancement and Size Reduction in Radio Frequency Identification Tags", also hereby incorporated by reference. Should a less conductive substrate for the RFID IC, such as GaAs of SOI (Silicon On Insulator) be used, the excavation-processing step would normally not be advantageous.

Figure 4:
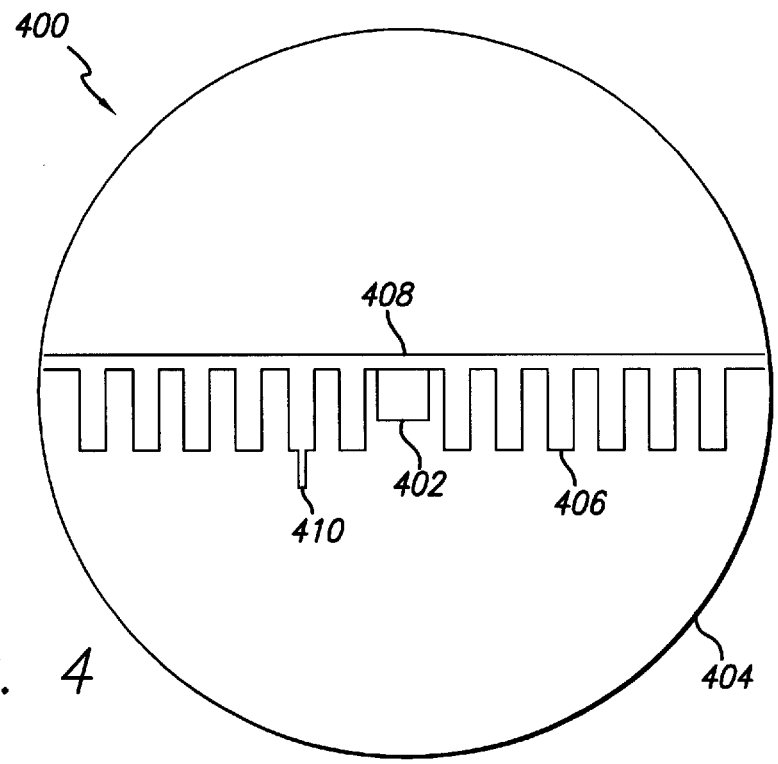
FIG. 4 is a top plan view of an exemplary RFID tag which employs RFID tag circuitry in the form of an RFID tag integrated circuit (IC) connected to a meander antenna.

Another RFID tag in accordance with the principles of the invention is illustrated in FIG. 4. The RFID tag 400 includes an RFID integrated circuit (IC) 402 that is affixed in a conventional manner to a substrate 404. A resonant wire dipole antenna 406 is connected to antenna terminals on the tag IC 402. The antenna 406 is referred to as a wire antenna to distinguish it from a patch antenna. The antenna 406 is not, however, a straight dipole antenna; it has a shape which permits it to fit within the limited space available within an RFID tag. Many variations of the antenna shape are possible, and a number of those variations are discussed in relation to the following figures. In each case an inductor is connected in series between the antenna and the RFID circuitry, the value of the inductor being selected in accordance with the principles of the present invention, to maximize the RFID tag read distance, as set forth above.

The antenna 406 may employ one or more loading bars, such as loading bar 408 and/or one or more tuning stubs, such as the tuning stub 410, to tune the IC/antenna to resonance at a preferred operational wavelength, is connected to antenna terminals on the tag IC 402. Although the illustrated antenna includes meanders that are rectangular, the meanders may be of any of a variety of shapes, including sinusoidal, clipped rectangular, and triangular. Tuning stubs, such as tuning stub 410 may be placed in any of a wide variety of locations along the antenna 406 and in any of a wide variety of orientations. The use of an antenna 406, such as a meander antenna, rather than a straight dipole antenna, permits the antenna 406 to be of a length which supports resonant operation. Consequently, the tag may be successfully read at a greater distance, sometimes as much as an order of magnitude greater, than a tag using a non-resonant antenna. If, for example, the RFID system employs a carrier frequency of 915 MHz, the corresponding signal wavelength would be approximately 32 cm and the half wavelength needed for resonant operation would be approximately 16 cm. This figure is only approximate, in part because the wavelength of interest is not the wavelength in free space, but the wavelength in the antenna material. In other words, the electrical length of the antenna, not the physical length of the antenna, should equal half the wavelength of the carrier frequency: 16 cm in this example. The read distance of the tag is further enhanced by connecting an inductor in series between the antenna and RFID circuitry in accordance with the principles of the present invention, as set forth above.

If the longest dimension of the tag 400, the diameter of the tag in this exemplary embodiment, is less than 16 cm, the meander configuration permits the inclusion of an antenna that has a total length equal to half a wavelength, for the illustrative carrier frequency. For example, if the diameter of the tag 400 is 100 mm and a meander antenna having an average of 10 mm per meander is employed, sixteen meanders, may be employed to provide the necessary antenna length. Similarly, a half wavelength of approximately 6 cm corresponds to a carrier frequency of 2.45 GHz and six meanders of 10 mm each would provide the length necessary for a resonant antenna at 2.45 GHz. However, if the meanders are placed too closely to one another, the antenna's performance will be severely degraded.

Figure 5:
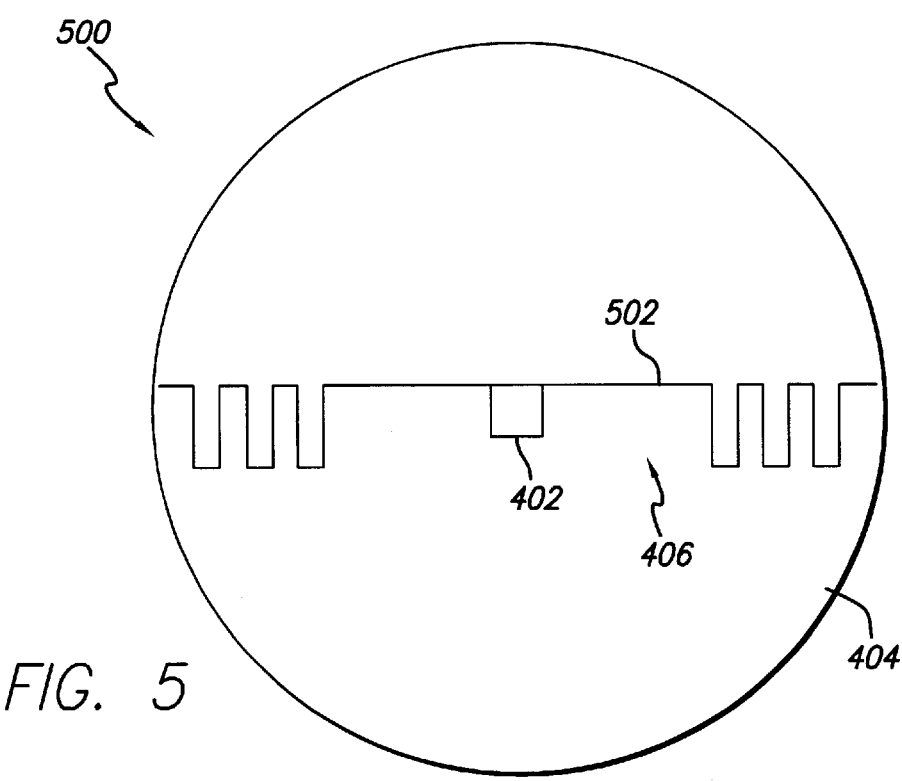
FIG. 5 is a top plan view of an illustrative embodiment of an RFID tag that employs a combination of a straight dipole and meander antennas.

In order to obtain optimal performance, the minimal meander required to provide a half wavelength antenna may be employed. The combination straight dipole/meander antenna of FIG. 5 provides the necessary antenna length without any unnecessary meander. The meander sections may be placed relatively close to the tag IC 402, or may be moved further toward the perimeter of the tag 500. The degree to which the antenna's length is devoted to straight dipole section and to meander sections may vary according to the intended application. Although not explicitly shown in the illustrations, the RFID tag of FIG. 5, and all the following figures, include an inductor connected in series between the RFID tag antenna and the RFID tag circuitry in accordance with the principles of the invention.

Figure 6:
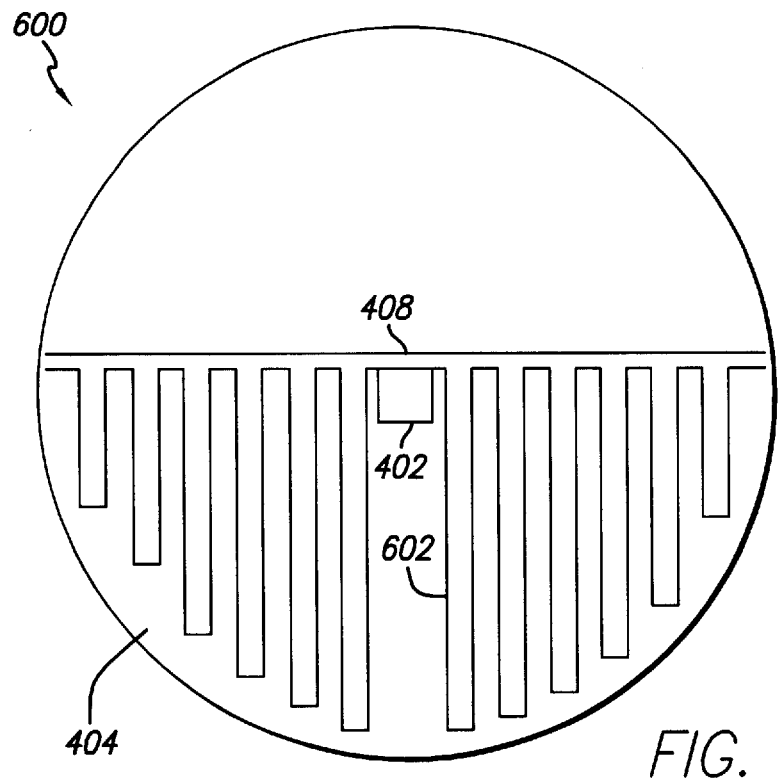
FIG. 6 is a top plan view of an illustrative embodiment of an RFID tag that includes a non-uniform meander antenna.

A tag IC 600 illustrated in the top plan view of FIG. 6 includes a non-uniform meander antenna 602. The non-uniform meander antenna 602, as with all the antennas set forth in this description may employ one or more loading bars, such as loading bar 408, and/or one or more tuning stubs, such as tuning stub 410 illustrated in FIG. 4. The non-uniform meander antenna 602 permit resonant operation in the relatively confined space of a small RFID tag 600. The nonuniform meander may better utilize the available space on a surface of the tag 600, thereby permitting the use of a smaller tag at a given carrier frequency.

Figure 7:
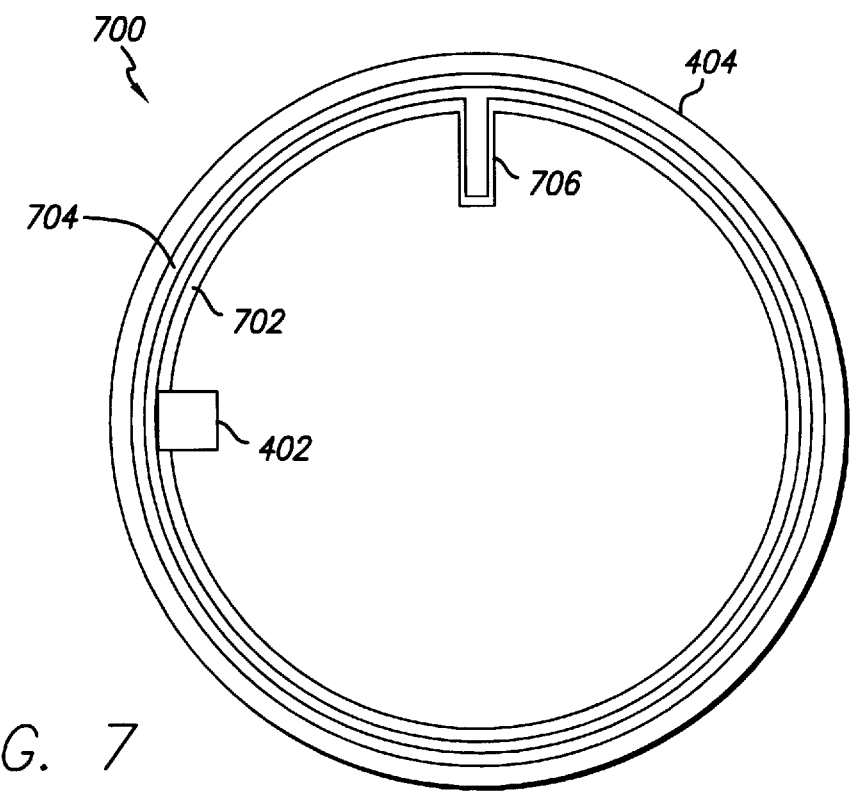
FIG. 7 is a top plan view of an illustrative embodiment of an RFID tag that employs a bent dipole antenna.

The RFID tag 700 of FIG. 7 employs a "bent dipole" antenna 702. The bent dipole avoids the interference problems associated with the meander antennas of previous figures yet provides the necessary antenna length to meet the desired half wavelength threshold. Typically, a bent dipole antenna 702 may be employed with a tag that provides more room than a tag such as might employ the meander or non-uniform meander tags previously described. A loading bar 704 and tuning stub 706 are also employed in this illustrative embodiment to tune the impedance of the antenna 702.

Figure 8:
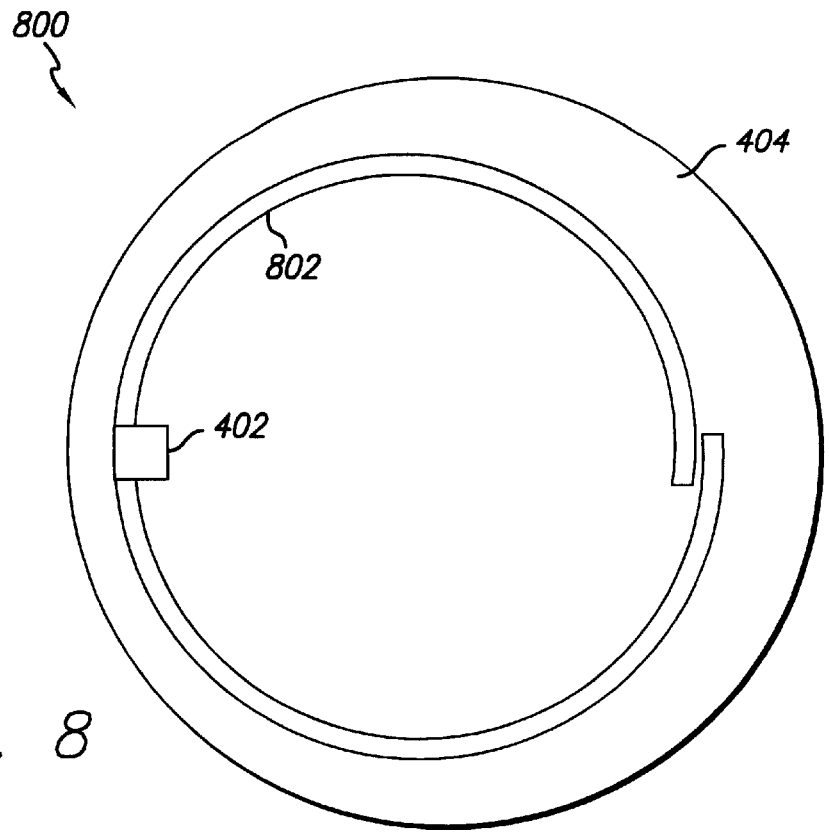
FIG. 8 is a top plan view of an illustrative embodiment of an RFID tag that employs spiral antennas.
Figure 9:
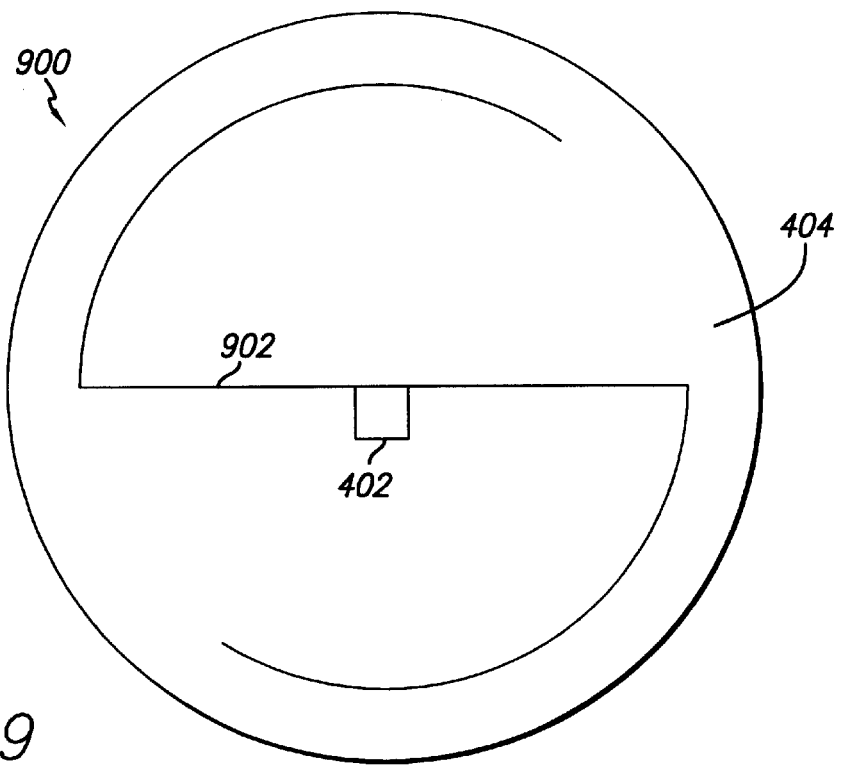
FIG. 9 is a top plan view of an illustrative embodiment of an RFID tag that employs a "z-shaped" antenna.
Figure 10:
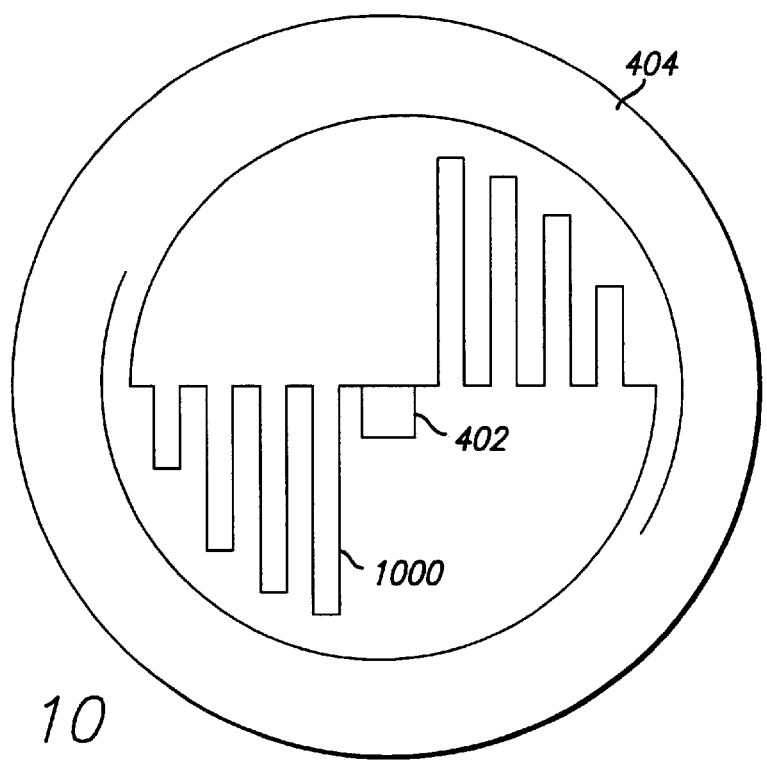
FIG. 10 is a top plan view of an illustrative embodiment of an RFID tag that employs an antenna which is a combination of spiral and non-uniform meander antennas.

A tag 800, illustrated in the top plan view of FIG. 8 employs a spiral antenna 802, which may be an Archimedes spiral, for example. The spiral type antenna provides flexibility in tuning the impedance of the antenna, as well as providing flexibility in obtaining circular polarization, when desired. As with the previous examples, the antenna 802 provides sufficient antenna length in the confined space available from an RFID tag 800. Similarly, a somewhat Z-shaped antenna 902 is employed by an RFID tag 900 of FIG. 9 to provide sufficient antenna length in a confined space. Generally, tags that employ antennas having a straight dipole in combination with other forms of antenna, such as, a bent dipole, a meander, spiral or other type, situate the straight dipole section of the antenna closest to the tag IC 402 in order to maximize performance. Additionally, the curved, meandered, or other sections are generally kept to a minimum, in order enhance performance.

Figure 11:
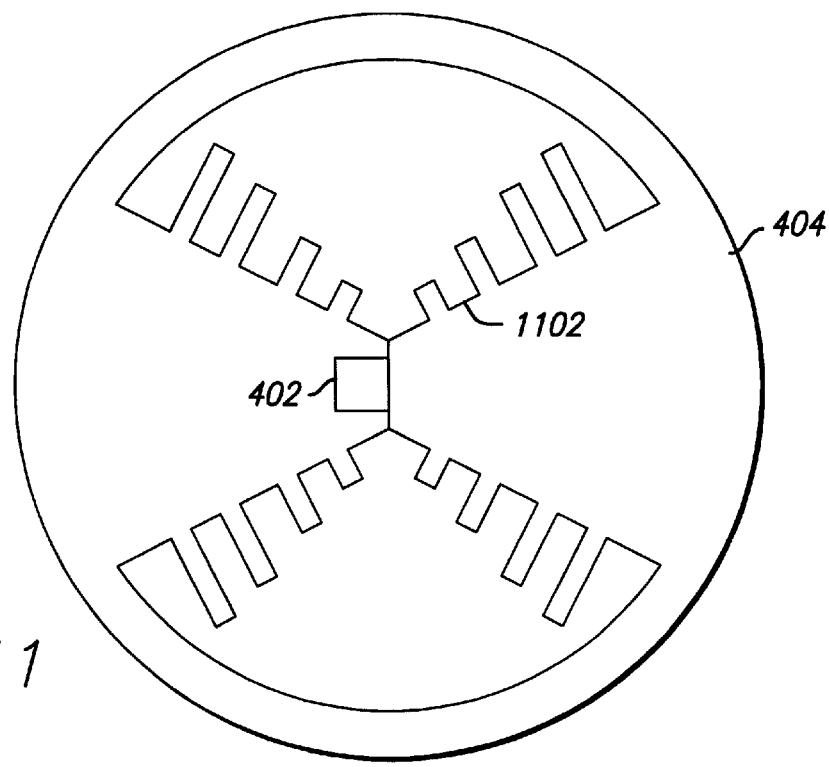
FIG. 11 is a top plan view of an illustrative embodiment of an RFID tag that employs an antenna that is a combination of a non-uniform meander and pinched dipole antennas.
Figure 12:
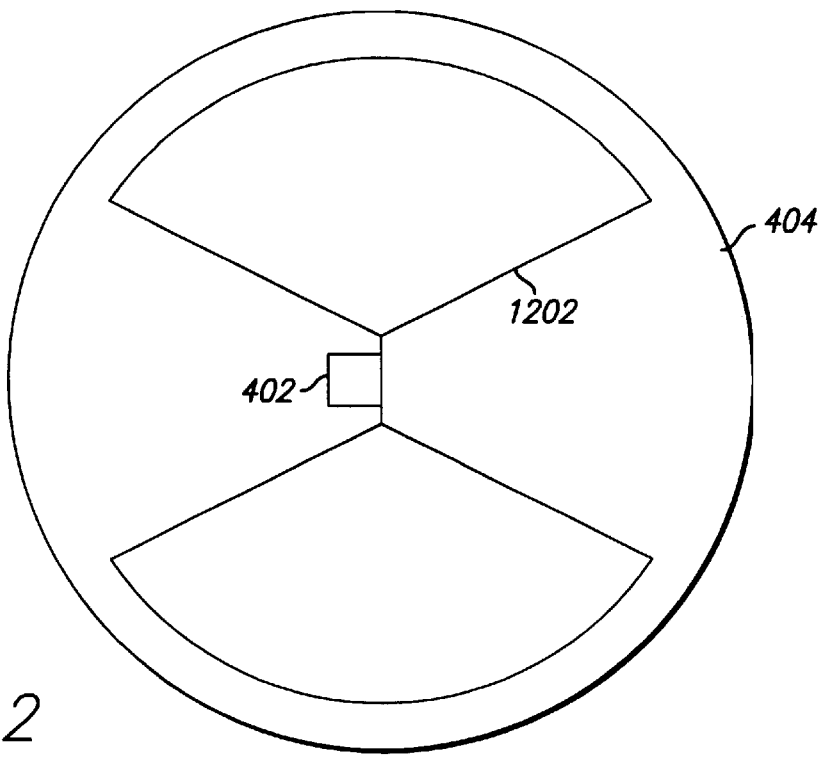
FIG. 12 is a top plan view of an illustrative embodiment of an RFID tag that employs a pinched dipole antenna.
Figure 13:
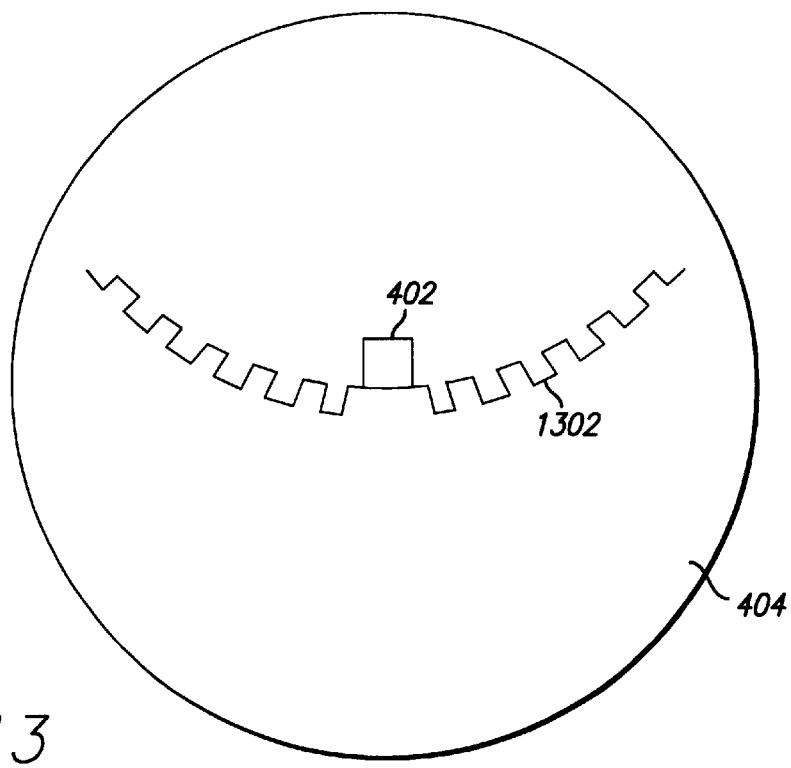
FIG. 13 is a top plan view of an illustrative embodiment of an RFID tag that employs bent meander antenna.

Combinations of the basic antenna shapes set forth above may be employed to optimize performance, cost, and other design factors. As an example, the antenna 1000 is a combination of the non-uniform meander and spiral antennas described above and the antenna 1102 of FIG. 11 is a combination of a "pinched dipole" antenna and a non-uniform meander antenna. The RFID tag 1200 of FIG. 12 employs a pinched dipole antenna 1202 and the RFID tag 1300 of FIG. 13 employs a bent meander antenna 1302.

Any of the antenna configurations discussed above may be used in cooperation with a ground plane located on the opposite side of the substrate 404. A plurality of antennas, may be combined on the same substrate to provide circular or dual linear antennas with wider bandwidths than a single antenna may be able to provide. Additionally, the wire antennas may be replaced by their slot counterparts, whereby an antenna wire is replaced by a slot in a conductive surface, such as a metallized surface. In such a case, the slot may be "backed up" by a ground plane or cavity for improved gain and bandwidth performance.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A radio frequency identification transponder (RFID tag) comprising:

a tag antenna having impedance $Z_a$, radio frequency identification (RFID) circuitry responsive to electromagnetic signals received at the tag antenna, the circuitry having an input impedance $Z_L$, and an inductor having an impedance $Z_{ind}$ connected in series between the antenna and the RFID circuitry, the value of the inductor chosen to maximize the expression $[(R_a)(G_a)]^{1/2}|(Z_L)|/|(Z_a+Z_{ind}+Z_L)|$, where $|\ |$ indicates the absolute value of the enclosed expression.

2. The RFID tag of claim 1 wherein the imaginary part of the inductor impedance is equal in magnitude to the difference between the absolute value of the imaginary part of the antenna impedance and the absolute value of the imaginary part of the RFID circuitry impedance.

3. The RFID tag of claim 2 wherein the load resistance is minimized.

4. The RFID tag of claim 1 wherein the RFID circuitry is incorporated on a single integrated circuit.

5. The RFID tag of claim 4 wherein the inductor is incorporated on the integrated circuit.

6. The RFID tag of claim 5 wherein the inductor is formed using an integrated circuit excavation technique.

7. An RFID system comprising:

a base station, a radio frequency identification transponder (RFID tag) including:

a tag antenna having an impedance $Z_a$, radio frequency identification (RFID) circuitry responsive to electromagnetic signals received at the tag antenna, the circuitry having an input impedance $Z_L$, and an inductor having an impedance $Z_{ind}$ connected in series between the antenna and the RFID circuitry the value of the inductor chosen to maximize the expression $[(R_a)(G_a)]^{1/2}|(Z_L)|/|(Z_a+Z_{ind}+Z_L)|$, where $[\ ]$ indicates the absolute value of the enclosed expression.

8. The system of claim 7 wherein the imaginary part of the inductor impedance is equal in magnitude to the difference between the absolute value of the imaginary part of the antenna impedance and the absolute value of the imaginary part of the RFID circuitry impedance.

9. The system of claim 8 wherein the load impedance is minimized.

10. The system of claim 7 wherein the RFID circuitry is incorporated on a single integrated circuit.

11. The system of claim 10 wherein the inductor is incorporated on the integrated circuit.

12. The system of claim 11 wherein the inductor is formed using an integrated circuit excavation technique.

13. A method of maximizing an RFID tag read range, the tag including an antenna having an impedance $Z_a$ and RFID tag circuitry, or a load, having an input impedance $Z_L$, comprising the steps of:

determining the impedance $Z_L$ of the load, determining the impedance of the antenna $Z_a$, determining the value of an inductor which, when connected in series between the antenna and the RFID tag circuitry, maximizes the expression $[(R_a)(G_a)]^{1/2}(Z_L)|/|(Z_a+Z_{ind}+Z_L)|$, where [ ] indicates the absolute value of the enclosed expression, and connecting such an inductor in series between the antenna and the RFID tag circuitry.

14. The method of claim 13 wherein the inductor is selected such that the imaginary part of its impedance is equal in magnitude to the difference between the absolute value of the imaginary part of the antenna impedance and the absolute value of the imaginary part of the RFID tag circuitry impedance.

15. The method of claim 14 wherein the RFID circuitry is formed on a single integrated circuit.

16. The method of claim 15 wherein the inductor is incorporated on the integrated circuit.

17. The method of claim 16 wherein the inductor is formed using an integrated circuit excavation technique.

* * * * *